United States Patent [19]

Sato et al.

[11] 4,364,809

[45] Dec. 21, 1982

[54] METHOD FOR PREPARING CURED RUBBERY PRODUCTS OF ORGANOPOLY-SILOXANES

[75] Inventors: Yasuhiko Sato; Hiroshi Inomata; Hiroshige Okinoshima, all of Annaka, Japan

[73] Assignee: Shin-Etsu Chemical Co., Ltd., Tokyo, Japan

[21] Appl. No.: 127,523

[22] Filed: Mar. 5, 1980

[30] Foreign Application Priority Data

Mar. 19, 1979 [JP] Japan .................................. 54-32130
Mar. 26, 1979 [JP] Japan .................................. 54-35221

[51] Int. Cl.$^3$ ........................ C08F 2/48; C08F 130/08
[52] U.S. Cl. ............................. 204/159.13; 525/925; 526/279
[58] Field of Search .................................. 204/159.13

[56] References Cited

U.S. PATENT DOCUMENTS 3,726,710  4/1973  Berger et al. .................. 204/159.13
3,873,499  3/1975  Michael et al. ................ 204/159.13
4,064,027 12/1977  Gant ............................... 204/159.13

Primary Examiner—John C. Bleutge
Assistant Examiner—A. H. Koeckert
Attorney, Agent, or Firm—Hopgood, Calimafde, Kalil, Blaustein & Judlowe

[57] ABSTRACT

There is disclosed a method for preparing a rubbery cured product of an organopolysiloxane. This product is free from the problems caused by the limited crosslinking velocity or by the necessity of admixing a foreign material such as a crosslinking catalyzing curing agent or a photosensitizer. In this method, a substantially linear diorganopolysiloxane terminated at both chain ends with triorganosilyl groups, each of the triorganosilyl groups having, preferably, 2 or 3 vinyl groups bonded to the silicon atom, is irradiated with ultraviolet light having an energy distribution predominantly rich in the wavelength region from 100 to 300 nm or, preferably, from 180 to 250 nm whereby the energy of the ultraviolet light is most effectively utilized for effecting the crosslinking of the organopolysiloxane. When rapid decrease of the surface tackiness and rapid curing in the depth of a relatively thick layer are desired in the photocuring of the organopolysiloxane by the ultraviolet irradiation, the organopolysiloxane is admixed with small amounts of an organic peroxide.

5 Claims, 1 Drawing Figure

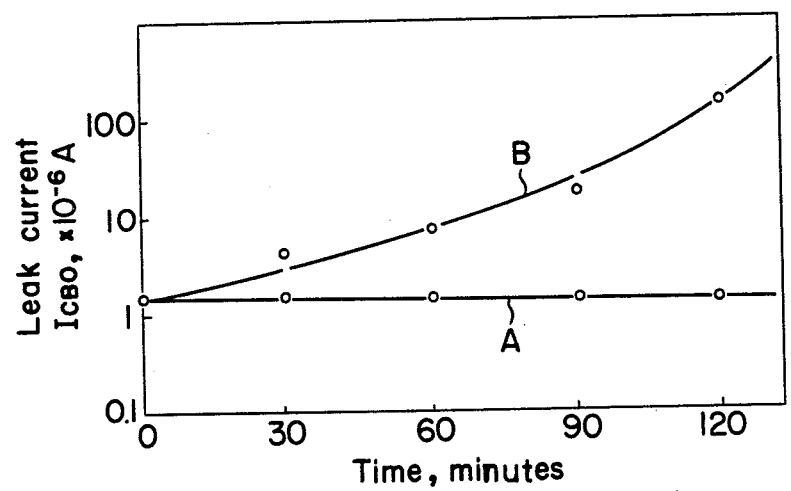
FIGURE

METHOD FOR PREPARING CURED RUBBERY PRODUCTS OF ORGANOPOLY-SILOXANES

BACKGROUND OF THE INVENTION

The present invention relates to a method for the preparation of a cured rubbery product of an organopolysiloxane or, more particularly, to a method for the preparation of a cured rubbery product by irradiating an organopolysiloxane with ultraviolet light.

As is well known, cured products of silicones having rubbery elasticity are very useful materials in a wide field of applications. Curing of organopolysiloxanes by crosslink formation to be imparted with rubbery elasticity is carried out in several procedures according to the curability of the individual organopolysiloxanes. Most typically, silicone rubbers are obtained by heating a diorganopolysiloxane composition admixed with a curing agent such as an organic peroxide. Several other types of organopolysiloxanes can be crosslinked by an addition reaction or condensation reaction between functional groups bonded to the silicon atoms in the presence of a suitable crosslinking catalyst. Most of the organopolysiloxanes capable of giving rubbery products can react only by heating or in the presence of a foreign material such as the curing agent or crosslinking catalyst.

These curing conditions in the prior art bring about limitations to the application of rubbery products of silicones. For example, a heat-curable organopolysiloxane cannot be used together with a substrate material unless the substrate material has a sufficient heat stability in the curing condition of the organopolysiloxane. Also, organopolysiloxanes curable only in the presence of a curing agent or a crosslinking catalyst are undesirable in applications where the presence of such a foreign material or decomposition product thereof is detrimental depending on its nature.

One way to avoid the above described difficulties in curing organopolysiloxanes is to use radiative energy to effect curing. For example, there have been proposed various types of organopolysiloxanes or organopolysiloxane compositions curable by irradiation with light which is rich in ultraviolet. The compounds include those organopolysiloxanes which have vinyl groups bonded to the silicon atoms. Unfortunately, there have been known hitherto no vinyl-containing organopolysiloxanes curable at a sufficiently rapid rate when irradiated with ultraviolet radiation. Therefore, all of the hitherto known means for curing vinyl-containing organopolysiloxanes utilize other components such as a photosensitizer or another kind of an organopolysiloxane having functional groups other than vinyl groups.

U.S. Pat. No. 3,726,710 discloses a vinyl-containing organopolysiloxane which is cured when irradiated with strong ultraviolet light in the presence of a photosensitizer which is admixed therewith. This method, which relies on a photosensitizer, is not always satisfactory due to the rather poor compatibility of the photosensitizer with the organopolysiloxane. Moreover, although such a vinyl-containing organopolysiloxane admixed with a photosensitizer may be satisfactorily cured when irradiated as a thin film such as a coating layer on a release paper, when a layer of, for example, 0.5 mm or larger thickness is used, the curing is not satisfactory. The resulting product, because of unsatisfactory curing, lacks good mechanical properties and transparency.

The photocuring of vinyl-containing organopolysiloxanes by the reaction with the other types of functional group-containing organopolysiloxanes is also known, U.S. Pat. No. 3,873,499 discloses a composition comprising a mercapto-containing organopolysiloxane, a methylvinylpolysiloxane a gelation inhibitor while and U.S. Pat. No. 4,064,027 discloses a composition comprising a vinyl-containing organopolysiloxane and, an organohydrogenpolysiloxane having at least one hydrogen atom directly bonded to the silicon atom in a molecule and a photosensitizer. The curing in the former composition utilizes a crosslinking reaction between the vinyl groups and the mercapto groups in the organopolysiloxane and curing in the latter compositions utilizes an addition reaction between the vinyl groups and the silicon-bonded hydrogen atoms in the organopolysiloxanes.

The above discussed photocrosslinking reaction between the vinyl groups and mercapto groups proceeds with a satisfactorily high reaction rate only in the presence of a photosensitizer. The composition formulated with such a photosensitizer, however, has poor stability even when kept in the dark so that adequate storability requires the use of a stabilizing agent. Furthermore, a mercapto-containing organopolysiloxane is rather expensive due to the complicated steps synthesis thereof. Also, care must be taken in handling such an organopolysiloxane due to the unpleasant odor associated with the mercapto groups. The photocured products obtained from such a mercapto-containing organopolysiloxane are not desirable that they lack in stability have and inferior thermal resistance, particularly when the cured product is relatively thick.

Addition of a photosensitizer is also indispensable in the photocurable compositions disclosed in U.S. Pat. No. 4,064,027. The photosensitizer is undesirable because it lowers the mechanical strength those photocured products which have a relatively large thickness and because it causes the composition to foam.

The above described problems of photocuring of a vinyl-containing organopolysiloxane are partly due to the absorption characteristics of the organopolysiloxane in the ultraviolet region. As is known, vinyl groups bonded to the silicon atoms have strong absorption in the far ultraviolet region such that the extinction coefficient at the absorption maximum of 178 nm is as large as 17,000 but the vinyl-containing organopolysiloxanes are relatively transparent in the longer wavelength region while the energy distribution of the ultraviolet light emitted from conventional ultraviolet lamps is biased to the longer wavelength region and no sufficient energy output is obtained in the far ultraviolet necessitating the use of a photosensitizer. Thus, no satisfactory method is known hitherto for photocuring a vinyl-containing organopolysiloxane as such.

The search has continued for new methods of preparing cured products by the photocuring of a vinyl-containing organopolysiloxane. This invention was made as a result of that search.

OBJECTS AND SUMMARY OF THE INVENTION

A general object of the present invention is to avoid or substantially alleviate the above-described problems of the prior art.

A more specific object of the present invention is to provide a novel method for the preparation of a cured product obtained by the photocrosslinking of an organopolysiloxane in the absence of a photosensitizer. Other objects and advantages of this invention will become apparent from the following summary of the invention and description of its preferred embodiments.

The present invention provides a method for the preparation of a cured product of a organopolysiloxane. This method comprises irradiating an organopolysiloxane containing aliphatically unsaturated groups and having a substantially linear molecular structure as represented by the general formula

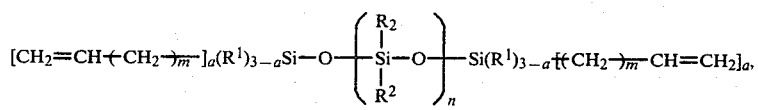

(I)

wherein $R^1$ is a substituted or unsubstituted monovalent hydrocarbon group free from aliphatic unsaturation, $R^2$ is a substituted or unsubstituted monovalent hydrocarbon group, m is zero or a positive integer not exceeding 4, a is an integer from 1 to 3 and n is zero or a positive integer, with ultraviolet light having an energy distribution predominantly rich in the wavelength region from 100 to 300 nm in the absence of a photosensitizer.

In the above general formula (I), the groups represented by the symbol $R^2$ are preferably free from aliphatic unsaturation to exclude aliphatically unsaturated hydrocarbon groups such as vinyl and allyl groups and the number a is preferably 2 or 3 so as that the terminal organosilyl groups each have two or three aliphatically unsaturated groups.

BRIEF DESCRIPTION OF THE DRAWING

The FIGURE graphically describes the leak current in a mesa type NPN transistor with continuous application of an inverse bias voltage at an elevated temperature as a function of time (see Example 9).

DETAILED DESCRIPTION OF THE PREFERRED EMBODIMENTS

The organopolysiloxane used in the present invention is represented by the above general formula (I) and has a substantially linear molecular structure. Small amounts of branching of the molecules may have no particular disadvantage with respect to the photocurability of the organopolysiloxane and the properties of the cured products thereof.

In the general formula (I), $R^1$ is a substituted or unsubstituted monovalent hydrocarbon group free from aliphatic unsaturation. Suitable $R^1$ groups, include for example, alkyl groups such as methyl, ethyl, propyl and butyl groups, cycloalkyl groups, such as cyclopentyl and cyclohexyl groups, aryl groups such as phenyl and tolyl groups, aralkyl groups such as benzyl and phenylethyl groups and those groups derived from these hydrocarbon groups by substituting halogen atoms or other substituent atoms or groups for part or all of the hydrogen atoms in the hydrocarbon groups such as 3,3,3-trifluoropropyl, 3-chloropropyl, chloromethyl, chlorophenyl and dibromophenyl groups. Preferred $R^1$ group are methyl and phenyl groups.

$R^2$ is a substituted or unsubstituted monovalent hydrocarbon group similar to those of the group $R^1$ but aliphatically unsaturated hydrocarbon groups or alkenyl groups such as vinyl and allyl groups are included in the $R^2$ groups. It is preferred, however, that the molar ratio of such aliphatically unsaturated groups in all of the $R^2$ groups bonded to the silicon atoms other than terminal silicon atoms in a molecule does not exceed 5%. This is because too much unsaturation bonded to the silicon atoms other than the terminal ones may decrease somewhat the rubbery elasticity of the cured products obtained by ultraviolet irradiation.

The suffix a in the general formula (I) is an integer from 1 to 3 so that each of the terminal silicon atoms has at least one aliphatically unsaturated hydrocarbon group expressed by the formula $CH_2=CH-(CH_2)_{\overline{m}}$, in which m may be zero or a positive integer not exceeding 4. The preferred value of m is zero or 1 so that the preferred terminal unsaturated groups are vinyl or allyl. The vinyl group is particularly preferred the ease in preparing this compound. Preferred values of the suffix a are 2 or 3 so as that each of the terminal silicon atoms has two or three aliphatically unsaturated groups or, in particular, vinyl groups bonded thereto due to the increased curing rate of the organopolysiloxane by ultraviolet irradiation as compared with organopolysiloxanes having an a value of 1.

When the hydrocarbon groups represented by $R^1$ and $R^2$ include phenyl or other aromatic groups, it is preferred that the number of such aromatic groups be limited because of the strong absorption of the ultraviolet light by these groups. The preferred upper limit of the aromatic groups in a molecule is 0.03 per silicon atom. When aromatic groups in excess of this limit is used, particularly with a thick cured product, the curing toward the bottom of the layer is remarkably retarded by the absorption in the top layer. Curing is rather accelerated by the introduction of aromatic groups when the thickness of the organopolysiloxane layer is very small.

The number n in the general formula (I) corresponds to the degree of polymerization of the organopolysiloxane and may be zero or a positive integer. Even the disiloxanes (n is zero) may be polymerized and cured by ultraviolet irradiation but it is preferred that n be at least 50 in order that the cured product of the organopolysiloxane might have good rubbery properties. No upper limit is given for the number n but when it is desired that the organopolysiloxane be fluid before curing, the upper limit is 1000 from a practical standpoint.

The organopolysiloxane material used in the present invention may be a mixture of two or more kinds of differently characterized organopolysiloxanes. For example, a blend of a high molecular weight diorganopolysiloxane having a gum-like consistency and a low molecular weight polysiloxane, e.g. down to hexaorganodisiloxane, may be used. It is sometimes advisable that certain mechanical properties of the cured products, e.g. tensile strength and tear strength, may be improved by using a mixture of a low vinyl-content organopolysiloxane and a high vinyl-content organopolysiloxane. An organopolysiloxane having a resin structure such as those composed of $SiO_2$ units, $R_3^2SiO_{0.5}$ units and $CH_2=CH-(CH_2)_{\overline{m}a}(R^1)_{3-a}SiO_{0.5}$ units may be admixed though in a limited amount, if desired, to improve the mechanical properties of the cured products. Small amounts of cyclic organopolysiloxanes may also be admixed with a linear organopolysiloxane. An example of such a cyclic organopolysiloxane is illustrated by the following structural formula, where s and t are each a positive integer with the proviso that the sum of s and t be from 3 to 8.

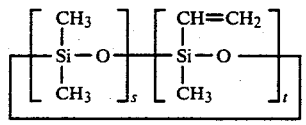

In addition to the above mentioned various organopolysiloxanes which are functional with the aliphatically unsaturated groups, small amounts of non-functional organopolysiloxanes may be admixed so as to improve the mold-releasability or to decrease the modulus of the cured products.

The method for the preparation of the above described organopolysiloxanes is coventional and need not be described here in detail.

When rapid disappearance of surface tackiness is desired in the photocuring of the organopolysiloxane, it is optional to admix the organopolysiloxane with small amounts of organic peroxides exemplified by peroxy ketals such as 1,1-bis(tertbutylperoxy)-3,3,5-trimethyl-cyclohexane, 2,2-bis(tert-butylperoxy) butane and the like, diacyl peroxides such as acetyl peroxide, isobutyl peroxide, benzoyl peroxide and the like, dialkyl peroxide such as di-tert-butyl peroxide, tert-butyl cumylperoxide, dicumyl peroxide, 2,5-dimethyl-2,5- di(tert-butylperoxy)hexane and the like and peresters such as tert-butylperoxy isopropylcarbonate and the like.

The amount of the organic peroxide to be admixed with the organopolysiloxane is determined according to the desired curability of the organopolysiloxane and the type of the peroxide but it is usually from 0.1 to 10% by weight or, preferably, from 0.5 to 5.0% by weight based on the organopolysiloxane.

The rubbery cured product of the present invention is obtained by irradiating with ultraviolet light the above described organopolysiloxane (with optionally added organic peroxide). It is essential that the ultraviolet light should have substantial energy distribution in the wavelength region of 100 to 300 nm or, preferably, 180 to 250 nm, because the organopolysiloxane is insensitive to ultraviolet light of 300 nm or longer in wavelength when irradiated in the absence of a photosensitizer as in the conventional photocurable organopolysiloxane compositions.

The light source for irradiating the organopolysiloxane may be any light source which emits light having an energy distribution which is predominantly in the wavelength region described above. Various lamps conventional are suitable for this purpose. These lamps includes, for example, low pressure-, high pressure- and ultra high pressure mercury lamps, xenon lamps and xenon-mercury lamps.

Of the above named lamps, high pressure mercury lamps are most suitable for industrial purposes because of their general availability. It should be noted, however, that the energy distribution of the ultraviolet light emitted from high pressure mercury lamps differs widely depending on the kind of gas sealed in the lamps. High pressure mercury lamps are classified into ozone- generating types and ozone-less types. The spectral energy distribution of the ultraviolet light in the former type covers the range from 180 nm to the visible region while the distribution in the latter type is low in the wavelength region from 180 to 250 nm. Therefore, the lamps of the former type are suitable in the method of the present invention. Incidentally, the ultraviolet light used in the present invention is not necessarily monochromatic but can be composed of a plurality of line spectra or band spectrum in so far as substantial energy distribution is obtained within the above mentioned region.

The irradiation time for complete curing of the organopolysiloxane according to the present invention depends, of course, on various parameters such as the kind of organopolysiloxane the, presence or absence of the organic peroxide, the thickness of the organopolysiloxane layer the, wavelength and intensity of the ultraviolet light and the like. Too long Irradiation for too long a time is undesirable because of the possible photodegradation of the cured organopolysiloxane. Thus, it is recommended that the irradiation time be determined with a test in advance of actual production.

Various kinds of conventional additive ingredients may be admixed with the organopolysiloxane including inorganic fillers, coloring agents such as pigments and dyes, flame retardants and the like. The amounts of these materials should not be so large as to substantially decrease the transparency to the ultraviolet light when improved mechanical properties are desired of the cured products.

An example of a suitable inorganic filler is a fumed silica conventionally used as formulated in silicone rubbers with optional surface treatment.

When a very thin layer of the cured organopolysiloxane is desired, the organopolysiloxane may be diluted with a suitable organic solvent such as n-hexane, toluene, xylene and the like.

The method of the present invention can provide rubbery cured products of organopolysiloxanes even without heating or without the addition of foreign materials such as photosensitizers. Furthermore, this method is free from the problem of so-called air inhibition leading to surface tackiness due to the adverse effects of atmospheric oxygen. Accordingly, the method of the present invention is particularly useful in various applications where heating or the presence of foreign materials are undesirable. These applications include electronic devices and medical instruments.

For example, a semiconductor device such as a transistor is coated with the organopolysiloxane with optional admixture of the organic peroxide over part or all of the surface and then irradiated with ultraviolet light to cure the organopolysiloxane into a film. In addition to transistors including mesa type transistors, planar type transistors and the like, the method of this invention is applicable to any kind of semiconductor devices such as diodes, integrated circuits, LSIs and the like.

The following examples illustrate the method of the present invention in further detail but should not be construed as limiting the scope of the invention in any way. Examples 2 and 7 are Comparative Examples.

EXAMPLE 1

A layer of 1 mm thickness was formed with a dimethylpolysiloxane terminated at both chain ends with dimethylvinylsilyl groups having a viscosity of 5000 centistokes at 25° C. This layer was irradiated with ultraviolet light using an ozone-generating high pressure mercury lamp of quartz sealed tube with a power of 80 watts/centimeters placed 15 cm apart from the organopolysiloxane layer. Irradiation for 10 minutes under cooling by air blowing gave a cured rubbery elastomer sheet (Experiment No. I).

The same experimental procedure was repeated as above except that 0.5% by weight of di-tert-butyl peroxide was admixed with the dimethylpolysiloxane. In this case, irradiation of 10 minutes was sufficient for completely curing a layer of the organopolysiloxane having a thickness of 2 millimeters (Experiment No. II).

When a layer of the dimethylpolysiloxane without the addition of the peroxide of 2 millimeters thickness was irradiated for 10 minutes, it was found that the degree of curing in the depth of the layer, i.e. in the bottom portion of the layer remote from the light source, was insufficient although curing in the superficial layer was complete (Experiment III).

The irradiation in the above Experiments No. I and No. II was carried out in an atmosphere of nitrogen instead of air or under cooling with ice instead of irradiation at room temperature. These conditions had rather little influences on the curing of the dimethylpolysiloxane.

COMPARATIVE EXAMPLE 2

The same procedure as in Experiment No. I and No. II above was repeated except that the ozone-generating high pressure mercury lamp was replaced by an ozone-less type high pressure mercury lamp of quartz sealed tube of approximately the same power.

Irradiation for 10 minutes resulted in viscosity increase and formation of soft gelled material for the dimethylpolysiloxane without the addition of the peroxide while the organopolysiloxane with the addition of the peroxide was cured excepting for the surface layer where the dimethylpolysiloxane remained oily.

EXAMPLE 3

A dimethylpolysiloxane terminated at both chain ends with methyldivinylsilyl groups and a dimethylpolysiloxane terminated at both chain ends with methylphenylvinylsilyl groups, both having a viscosity of 5000 centistokes at 25° C., were each spread in a layer of 2 millimeters thickness and irradiated with ultraviolet light under the same conditions as in Experiment No. I. The same procedure was repeated using the dimethylpolysiloxanes admixed with 0.5% by weight of di-tert-butyl peroxide or the same amount of dicumyl peroxide.

The times in minutes required for complete curing of the 2 millimeters layers were recorded as set out in Table 1 below.

TABLE 1

| Organic peroxide | Methyldivinyl-silyl-terminated dimethyl-polysiloxane | Methylphenylvinyl-silyl-terminated dimethyl-polysiloxane |
|---|---|---|
| None | 6 minutes | 10 minutes(*) |
| Di-tert-butyl peroxide | 5 minutes | 10 minutes(*) |
| Dicumyl peroxide | 1.5 minutes | 4 minutes |

(*)Curing in the depth of the layer was insufficient.

EXAMPLE 4

Photocurable compositions each were prepared by blending 100 parts by weight of the same dimethylvinylsilyl-terminated dimethylpolysiloxane as used in Example 1 or the same divinylmethylsilyl-terminated dimethylpolysiloxane as used in Example 3 with 10 parts by weight of a fumed silica filler surface-blocked with trimethylsiloxy groups and 0.5 part by weight of dicumyl peroxide. These compositions were irradiated in the form of a sheet having a thickness of 2 millimeters under the same irradiation conditions as in Experiment I to give cured rubbery sheets of the dimethylpolysiloxanes.

The irradiation time for complete photocuring and the mechanical properties, i.e. hardness in the JIS scale, ultimate elongation at break and tensile strength, of these cured sheets are set out in Table 2 below.

TABLE 2

|  | Dimethylvinylsilyl-terminated di-methylpolysiloxane | Divinylmethylsilyl-terminated di-methylpolysiloxane |
|---|---|---|
| Irradiation time, minutes | 5 | 1.5 |
| Hardness (JIS) | 24 | 24 |
| Ultimate elongation at break, % | 256 | 261 |
| Tensile strength, kg/cm$^2$ | 10 | 12 |

EXAMPLE 5

An organopolysiloxane composed of 50 mole % monomethylsiloxane units, 14 mole % vinylmethylsiloxane units and 36 mole % dimethylsiloxane units having a viscosity of 5000 centistokes at 25° C. was irradiated with ultraviolet light for 10 minutes under the same conditions as in Experiment I. A cured product was obtained.

A composition composed of 100 parts by weight of the above described organopolysiloxane, 2 parts by weight of the same fumed silica filler as used in Example 4 and 0.5 part by weight of dicumyl peroxide was prepared and irradiated with ultraviolet light under the same conditions as above. The composition irradiated for 4 minutes in the form of a sheet of 2 millimeters thickness was converted into a cured product having a hardness of 60 on the Shore D scale.

EXAMPLE 6

A composition composed of 100 parts by weight of a dimethylpolysiloxane terminated at both chain ends with methylvinylphenylsilyl groups and having a viscosity of 5000 centistokes at 25° C., and 20 parts by weight of a fumed silica whose surface was treated with hexamethyldisilazane was prepared and spread on a glass plate in a layer of 10 to 20 millimicron thickness with subsequent irradiation with ultraviolet light under the same conditions as in Experiment I. Irradiation for 90 seconds gave a cured rubbery film free of surface tackiness and insoluble in organic solvents such as acetone, toluene and the like.

COMPARATIVE EXAMPLE 7

The same dimethylpolysiloxane as used in Example 1 was admixed with 0.5% by weight of benzophenone and irradiated with ultraviolet light under the same conditions as in Experiment I. Irradiation for 2 minutes gave an opaque cured product which was rubbery but mechanically somewhat fragile.

On the other hand, when the benzophenone of the above experiment was replaced with the same amount of dicumyl peroxide, and the composition was radiated for 6 minutes, there resulted a cured rubbery product which was transparent and had excellent mechanical properties.

EXAMPLE 8

A dimethylpolysiloxane terminated at both chain ends with dimethylallylsilyl groups and having a viscosity of 52,000 centipoise at 25° C. was spread in a film of 50 millimicrons thickness and irradiated with ultraviolet light under the same conditions as in Experiment I. Irradiation for 5 minutes gave a rubbery cured product having no surface tackiness.

EXAMPLE 9

A photocurable composition was prepared by uniformly blending 100 parts by weight of a dimethylpolysiloxane terminated at both chain ends with methylvinylphenylsilyl groups and having a viscosity of 5000 centistokes at 25° C. and 12.5 parts by weight of a fumed silica filler having a specific surface area of 180 $m^2/g$ square meters per gram and surface-blocked with trimethylsiloxy groups. The composition thus prepared had a viscosity of 200 poise at 25° C. and the sodium, potassium and chlorine contents as the impurities were 0.5 p.p.m., 0.6 p.p.m. and 7 p.p.m., respectively.

A mesa type NPN transistor having a $V_{CB}$ inverse breakdown voltage of 500 volts was uniformly coated with the above prepared composition and irradiated with ultraviolet light under air cooling by use of an ozone-generating mercury lamp of quartz sealed tube having a power of 80 watts/centimeter and placed 8.5 centimeters apart from the coated transistor. Irradiation for 10 minutes gave a coated film having a thickness of 100 millimicrons maximum and completely free from surface tackiness.

The thus surface-coated transistor was further encapsulated with a silicone molding compound KMC-10 (a trade name of Shin-Etsu Chemical Co., Japan) and the leak current $I_{CBO}$ in the transistor with application of an inverse bias voltage was determined by applying a DC voltage of 120 volts of inverse polarity between the collector and the base at 105° C. The results are shown by curve A of the figure.

For comparison, the same experiment as above was repeated except that the coating of the mesa type NPN transistor was carried out by use of an organopolysiloxane composition composed of 100 parts by weight of a room temperature-curable organopolysiloxane KJR-4012 (a product of Shin-Etsu Chemical Co., Japan) having a viscosity of 30 poise at 25° C. and containing 0.3 p.p.m. of sodium, 0.5 p.p.m. of potassium and 5 p.p.m. of chlorine as the impurities, 0.04 part by weight of dibutyltin dioctoate and 0.04 part by weight of tetraisopropyl titanate followed by drying for 24 hours in an atmosphere of 60% relative humidity at 40° C. and subsequent heating in an atmosphere of nitrogen first at 150° C. for 12 hours and then at 200° C. for 24 hours to effect curing of the composition. Encapsulation of the thus coated transistor was carried out in the same manner as above.

The results of the leak current measurement in the thus coated and encapsulated transistor under the same conditions as above were as shown in the figure by curve B.

EXAMPLE 10

A planar type NPN transistor having a $V_{CB}$ inverse breakdown voltage of 450 volts was coated uniformly with a photocurable composition composed of 100 parts by weight of an organopolysiloxane having a viscosity of 5000 centipoise at 25° C. and composed of 50 mole % methylsiloxane units, 14 mole % methylvinylsiloxane units and 36 mole % dimethylsiloxane units and 0.5 part by weight of di-tert-butyl peroxide followed by irradiation with ultraviolet light using two mercury lamps (of the same type as used in Example 9) placed 13.5 centimeters apart from the coated transistor for 10 minutes. The photocurable composition was into a cured film having no surface tackiness with a thickness of 1 millimeter at the maximum.

The thus coated transistor was encapsulated with the same silicone molding compound as used in Example 9 under the same conditions and the leak current $I_{CES}$ was determined with application of 250 volts of inverse voltage between the collector and the base in an atmosphere at 125° C. to give a value of 0.1 $\mu A$. The value of the leak current was recorded with continuous application of the voltage every 30 minutes. The value after 120 minutes was also 0.1 $\mu A$, indicating no changes.

EXAMPLE 11

A photocurable composition was prepared by uniformly blending 100 parts by weight of a dimethylpolysiloxane terminated at both chain ends with dimethylvinylsilyl groups and having a viscosity of 10,000 centipoise at 25° C., 10 parts by weight of the same surface treated silica filler as used in Example 9, and 0.5 part by weight of dicumyl peroxide. A planar type NPN transistor having a $V_{CB}$ inverse voltage of 450 volts was coated with the thus prepared photocurable composition and irradiated with ultraviolet light for 6 minutes in the same manner as in Example 10 to give a cured film of 1 millimeter thickness at the maximum and having no surface tackiness.

The thus coated transistor was encapsulated with the same silicone molding compound as used in Example 9 under the same conditions and the value of the inverse breakdown voltage $V_{CB}$ and the change of the wave form thereof in time were examined to show no recognizable changes even after 470 hours with excellent stability.

EXAMPLE 12

A photocurable composition was prepared by uniformly blending 100 parts by weight of a gum-like dimethylpolysiloxane terminated at both chain ends with trimethylsilyl groups and having a viscosity of about $10^7$ centistokes at 25° C., 0.2 part by weight of 1,3-dimethyl-1,1,3,3-tetravinyldisiloxane and 1 part by weight of tert-butyl cumylperoxide and the composition was irradiated under the same conditions as in Example 1 to be cured within 60 seconds into a rubber elastomer having good mechanical properties.

EXAMPLE 13

A dimethylpolysiloxane of linear molecular structure terminated at both chain ends with trivinylsilyl groups and having a viscosity of about 3000 centistokes at 25° C. was admixed with 5% by weight of tert-butyl cumylperoxide dissolved therein and spread on a glass plate at a thickness of 1 millimeter. The organopolysiloxane layer was irradiated with ultraviolet light using an ozone-generating type ultraviolet lamp having 2 kilowatts power placed 10 centimeters apart above the organopolysiloxane layer for 10 seconds to cure the organopolysiloxane into a rubbery elastomer with good mechanical properties.

In place of the trivinylsilyl-terminated dimethylpolysiloxane used above, a phenyldivinylsilyl-terminated dimethylpolysiloxane with a similar molecular structure and about the same viscosity was used. In this case, curing was complete by the irradiation for 6 seconds in a thin film of about 20 millimeters thickness but somewhat incomplete in the depth of a 1 mm thick layer.

No surface takiness was observed in both of the above experiments.

EXAMPLE 14

Two kinds of photocurable compositions A and B were prepared with the trivinylsilyl-terminated and phenyldivinylsilyl-terminated dimethylpolysiloxane fluids used in Example 13 by uniformly admixing the same fumed silica filler as used in Example 9 and tert-butyl cumene peroxide with the formulations indicated in Table 3 below. The compositions A and B had a viscosity of 75 poise and 78 poise at 25° C., respectively.

Each of the above compositions was spread in a thickness of 2 millimeters and irradiated with ultraviolet light under the same conditions as in Example 13 and cured into a rubbery sheet. The mechanical properties determined according to the procedure specified in JIS are set forth in Table 3.

TABLE 3

|  | A | B |
|---|---|---|
| Trivinylsilyl-terminated dimethylpolysiloxane, parts by weight | 100 | 50 |
| Phenyldivinylsilyl-terminated dimethylpolysiloxane, parts by weight | 0 | 50 |
| Fumed silica filler, parts by weight | 10 | 10 |
| Peroxide, parts by weight | 5 | 5 |
| Hardness (JIS, type A) | 24 | 23 |
| Ultimate elongation, % | 161 | 150 |
| Tensile strength, kg/cm$^2$ | 11 | 10 |

The principles, preferred embodiments, and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in this art without departing from the spirit of the invention.

What is claimed is:

1. A method for the preparation of a rubbery cured product of an organopolysiloxane which comprises irradiating an organopolysiloxane containing aliphatically unsaturated groups and having a substantially linear molecular structure as represented by the general formula

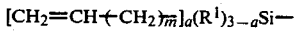

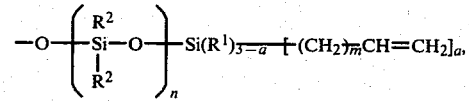

wherein
R$^1$ is a methyl or a phenyl group
R$^2$ is a substituted or unsubstituted monovalent hydrocarbon group, m is zero, a is 2 or 3, and n is zero or a positive integer, with ultraviolet light in the wavelength region from 100 to 300 nm in the absence of a photosensitizer and the molar ratio of the aliphatically unsaturated groups to all of the hydrocarbon groups represented by the symbol R$^2$ in a molecule of the organopolysiloxane is 10% or less.

2. The method of claim 1 wherein the molar ratio of aromatic hydrocarbon groups represented by the symbols R$^1$ and R$^2$ to the silicon atoms in a molecule is up to 0.03.

3. The method of claim 1 wherein the number n is at least 10.

4. The method of claim 1 wherein the organopolysiloxane is admixed with an organic peroxide.

5. The method of claim 4 wherein the amount of the organic peroxide is from 0.1 to 10% by weight based on the organopolysiloxane.

* * * * *